United States Patent
Ishikawa (10) Patent No.: US 7,542,023 B2
(45) Date of Patent: Jun. 2, 2009

(54) SHIFT REGISTER HAVING SKIP FUNCTION, AND DISPLAY DRIVER DEVICE, DISPLAY DEVICE AND ELECTRONIC INSTRUMENT USING THE SAME

(75) Inventor: Atsushi Ishikawa, Suwa (JP)

(73) Assignee: Seiko Epson Corporation (JP)

( * ) Notice: Subject to any disclaimer, the term of this patent is extended or adjusted under 35 U.S.C. 154(b) by 743 days.

(21) Appl. No.: 11/037,776

(22) Filed: Jan. 18, 2005

(65) Prior Publication Data

US 2005/0184932 A1    Aug. 25, 2005

(30) Foreign Application Priority Data

Jan. 19, 2004   (JP) .............................. 2004-010458

(51) Int. Cl.
G09G 3/36 (2006.01)
G11C 19/00 (2006.01)

(52) U.S. Cl. ............................ 345/100; 377/64; 377/77

(58) Field of Classification Search ........... 345/55–100, 345/204–214; 377/64–81
See application file for complete search history.

(56) References Cited

U.S. PATENT DOCUMENTS

| 5,801,981 | A * | 9/1998 | Iwakiri | 365/73 |
| 7,023,415 | B2 * | 4/2006 | Fujita et al. | 345/98 |
| 7,106,292 | B2 * | 9/2006 | Moon | 345/100 |
| 7,289,097 | B2 * | 10/2007 | Gyouten et al. | 345/100 |
| 2002/0063676 | A1 * | 5/2002 | Murade et al. | 345/100 |
| 2003/0231253 | A1 * | 12/2003 | Kakumoto | 348/308 |

FOREIGN PATENT DOCUMENTS

JP        05-019714       1/1993

* cited by examiner

*Primary Examiner*—David L Lewis
(74) *Attorney, Agent, or Firm*—Harness, Dickey & Pierce, P.L.C.

(57) ABSTRACT

A shift register includes M (M is an integer larger than two) stages of transfer elements and a control circuit. The M stages of the transfer elements transfer N (M>N, N is an integer larger than one) data signals sequentially input within one cycle. To the control circuit, N clock signals and a control signal are input within the one cycle and the control circuit supplies a shift clock signal to N stages of the transfer elements among the M stages of the transfer elements and supplies a skip fixed logic signal to (M−N) stages of the transfer elements among the M stages of the transfer elements based on the control signal.

13 Claims, 10 Drawing Sheets

SHIFT REGISTER HAVING SKIP FUNCTION, AND DISPLAY DRIVER DEVICE, DISPLAY DEVICE AND ELECTRONIC INSTRUMENT USING THE SAME

Japanese Patent Application No. 2004-10458, filed on Jan. 19, 2004, is hereby incorporated by reference in its entirety.

BACKGROUND OF THE INVENTION

The present invention relates to a shift register having a skip function, and a display driver device, a display device, and an electronic instrument using the same.

A conventional shift register includes N stages of transfer elements which transfer N data signals sequentially input within one cycle. N clock signals are input to the shift register within one cycle. Each of the N stages of transfer elements holds the input data signal instead of the data signal which has been held by that transfer element based on the clock signal. 1-bit data is sequentially shifted at each clock cycle in this manner.

In the case of driving a fluorescent display tube, display data and non-display data must be alternately written into the transfer elements of the shift register.

In this case, it is necessary to transfer data by alternately inputting display data and non-display data (data "0", for example) to the shift register as the N signals while inputting N clock signals to the shift register.

As described above, since the non-display data must also be written into the shift register, the transfer time is increased. Moreover, since image processing of the non-display data is necessary, load imposed on an MPU or CPU is increased. Furthermore, it is necessary to secure the memory capacity required for the image processing of the non-display data.

Japanese Patent Application Laid-Open No. 5-19714 discloses a line-sequential drive method which can be applied to a fluorescent display tube. However, Japanese Patent Application Laid-Open No. 5-19714 discloses neither a specific example of the above-described drive of the fluorescent display tube nor its data transfer.

BRIEF SUMMARY OF THE INVENTION

A first aspect of the present invention relates to a shift register including:

M (M is an integer larger than two) stages of transfer elements which transfer N (M>N, N is an integer larger than one) data signals sequentially input within one cycle; and a control circuit to which N clock signals and a control signal are input within the one cycle and which supplies a shift clock signal to N stages of the transfer elements among the M stages of the transfer elements and supplies a skip fixed logic signal to (M–N) stages of the transfer elements among the M stages of the transfer elements based on the control signal, wherein each of the N stages of the transfer elements holds an input data signal instead of a data signal which has been held by the each of the N stages of the transfer elements based on the shift clock signal, and wherein each of the (M–N) stages of the transfer elements allows a data signal which has been held by one of the transfer elements in a preceding stage to pass therethrough to one of the transfer elements in a subsequent stage based on the skip fixed logic signal.

A second aspect of the present invention relates to a display driver device including:

the above shift register;

a latch circuit connected with output lines of the N stages of the transfer elements of the shift register; and a driver circuit which outputs a display signal based on the data signal latched by the latch circuit.

A third aspect of the present invention relates to a display device including:

the above display driver device; and a display panel driven by the display driver device.

A fourth aspect of the present invention relates to an electronic instrument including the above display device.

DETAILED DESCRIPTION OF THE EMBODIMENT

The present invention may provide a shift register which can skip-transfer N pieces of data, the number of which is smaller than the number M of stages of transfer elements, by using the M stages of transfer elements and N clock signals, and a display driver device, a display device and an electronic instrument using the same.

A shift register according to an embodiment of the present invention includes:

M (M is an integer larger than two) stages of transfer elements which transfer N (M>N, N is an integer larger than one) data signals sequentially input within one cycle; and a control circuit to which N clock signals and a control signal are input within the one cycle and which supplies a shift clock signal to N stages of the transfer elements among the M stages of the transfer elements and supplies a skip fixed logic signal to (M–N) stages of the transfer elements among the M stages of the transfer elements based on the control signal, wherein each of the N stages of the transfer elements holds an input data signal instead of a data signal which has been held by the each of the N stages of the transfer elements based on the shift clock signal, and wherein each of the (M–N) stages of the transfer elements allows a data signal which has been held by one of the transfer elements in a preceding stage to pass therethrough to one of the transfer elements in a subsequent stage based on the skip fixed logic signal.

Since the N pieces of data, the number of which is smaller than the number M of stages of the transfer elements, can be skipped using the M stages of transfer elements and the N clock signals, the data transfer time can be reduced.

With this shift register, each of the M stages of the transfer elements may include a first clocked inverter provided in an upstream in a shift direction of the data signals, and a flip-flop connected in series with the first clocked inverter in a downstream in the shift direction, and the flip-flop may include second and third clocked inverters which are loop-connected.

With this shift register, the shift clock signal may have a first edge and a second edge, the first clocked inverter may reverse an input data signal and may transfer the reversed data signal, at a timing of the first edge of the shift clock signal, and the second clocked inverter may reverse a data signal input through the first clocked inverter and may transfer the reversed data signal, at a timing of the second edge of the shift clock signal.

The data can be thus transferred by the transfer elements according to the shift clock signal.

The second and third clocked may invert hold logic of the data signal transferred at the timing of the second edge.

The skip fixed logic signal may include a first fixed logic signal supplied to the first clocked inverter, and a second fixed logic signal supplied to the flip-flop, the second fixed logic signal having a phase which is a reverse of a phase of the first fixed logic signal, and each of the (M−N) stages of the transfer elements may allow a data signal which has been held by one of the transfer elements in the preceding stage to pass therethrough to one of the transfer elements in the subsequent stage based on the first and second fixed logic signals.

This shift register can implement a bidirectional shift register.

In this case, a reverse shift signal, which designates a reverse shift direction differing from the shift direction, may be further input to the control circuit, a fourth clocked inverter, which is loop-connected with the first clocked inverter, may be further provided, and upon receiving the shift signal, the control circuit may supply a third fixed logic signal, and the flip-flop may be formed by the first and fourth clocked inverters provided in a downstream of the third clocked inverter in the reverse shift direction, the third fixed logic signal setting the second clocked inverter in an open state.

With this shift register, in a cycle subsequent to the one cycle, the control circuit may supply the shift clock signal to the (M−N) stages of the transfer elements and may supply the skip fixed logic signal to the M stages of the transfer elements based on the control signal.

This enables one transfer element to be selectively used for data transfer and data through in cycle units.

With this shift register, the M stages of the transfer elements may be disposed in one of odd-numbered stages and even-numbered stages, and the (M−N) stages of the transfer elements may be disposed in the other of the odd-numbered stages and the even-numbered stages. However, the present invention is not limited thereto.

A display driver device according to another embodiment of the present invention includes:

the above shift register;

a latch circuit connected with output lines of the N stages of the transfer elements of the shift register; and a driver circuit which outputs a display signal based on the data signal latched by the latch circuit.

This display driver device may further include a logic fixing circuit which fixes logic of an output from one of the transfer elements which has allowed one of the data signals to pass therethrough based on the control signal.

A display device according to a further embodiment of the present invention includes:

the above display driver device; and a display panel driven by the display driver device.

With this display device, the display panel may be a fluorescent display tube, and the display driver device may output the display signal to a plurality of anode lines of the fluorescent display tube.

The present invention may be applied to a display device using other display methods, such as a liquid crystal display device or an EL display device.

An electronic instrument according to a still further embodiment of the present invention includes the above display device.

This is achieved on condition that the display driver device which drives a display panel of various electronic instruments include the shift register of the present invention.

The embodiments of the present invention are described below with reference to the drawings.

Display Device

Figure 1:
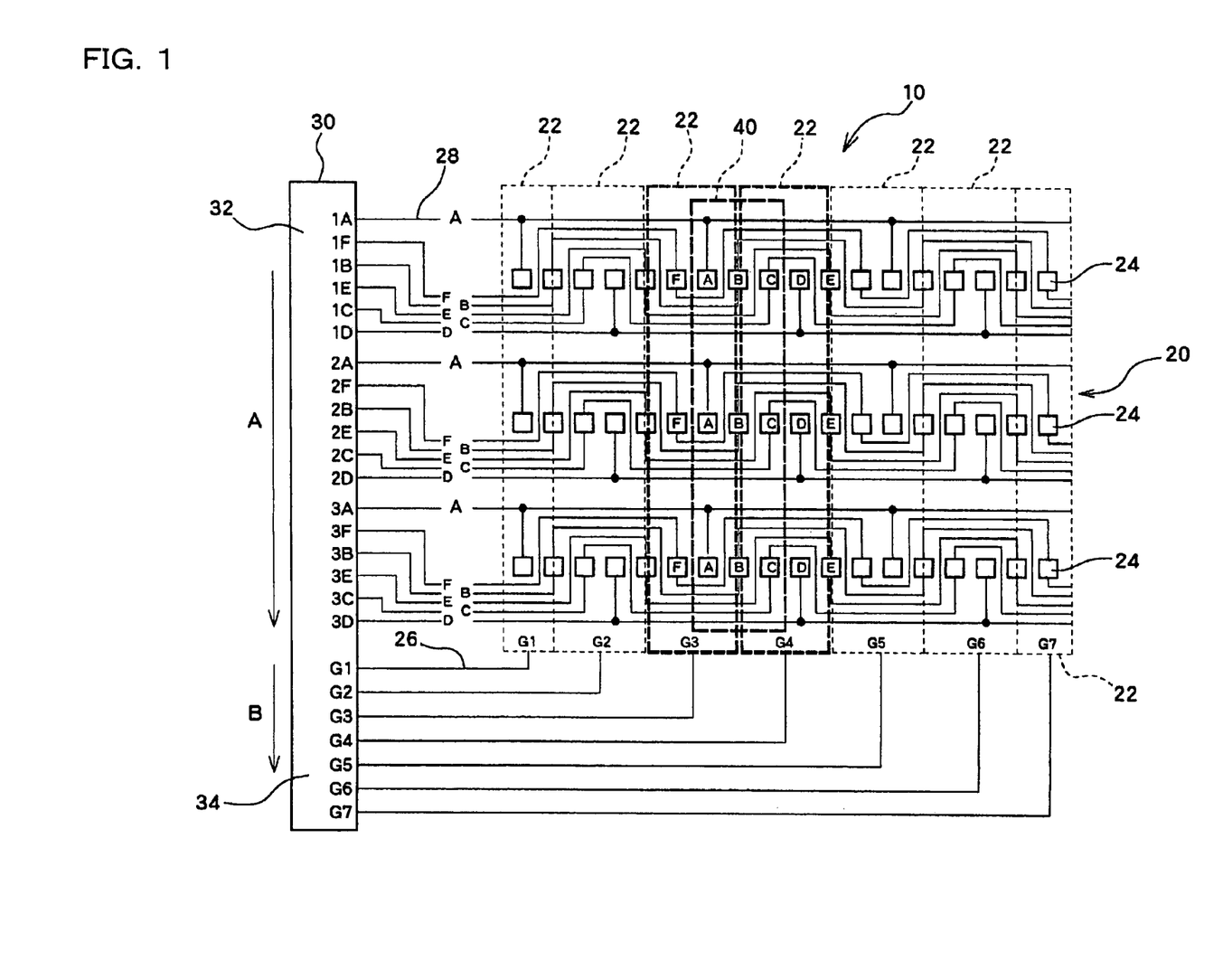
FIG. 1 illustrates a display device (fluorescent display device) which is an embodiment of the present invention.

FIG. 1 illustrates a fluorescent display device 10 as an example of a display device to which the present invention is applied. In FIG. 1, the fluorescent display device 10 includes a fluorescent display tube 20 and a display driver device 30.

The fluorescent display tube 20 includes seven grids 22 (G1 to G7) and Q (such as 54) anodes 24 facing the grids 22, for example. A grid line 26 is connected with each of the seven grids 22. Eighteen anodes 24 are provided in each of three stages. Six anode lines 28 are connected with the 18 anodes 24 provided in each stage. One of the anode lines 28 is connected in common with the nth (n is an arbitrary number from the left end; n=1 to 6), (n+6)th, and (n+12)th anodes 24.

Anode signals supplied to the six anode lines 28 in the first stage are referred to as 1A to 1F, anode signals supplied to the six anode lines 28 in the second stage are referred to as 2A to 2F, and anode signals supplied to the six anode lines 28 in the third stage are referred to as 3A to 3F. In the first stage, the anode signals 1A to 1F are sequentially supplied to the anodes 24 arranged from the left end of the fluorescent display tube 20. Therefore, the anode line 28 which supplies the anode signal 1A is connected in common with the first, seventh, and thirteenth anodes 24 from the left end. The same description also applies to the other two stages.

The display driver device 30 includes an anode driver circuit 32 and a grid driver circuit 34. The anode driver circuit 32 outputs the 18 anode signals 1A to 1F, 2A to 2F, and 3A to 3F to the 18 anode lines 28 at the same time. The anode driver circuit 32 includes a shift register which transfers data signals in the direction of an arrow A shown in FIG. 1. The 18 anode signals are generated based on the outputs from the shift register.

The grid driver circuit 34 outputs signals which selectively drive two adjacent grids 22 among the seven grids 22. The grid driver circuit 34 includes a shift register which transfers scan signals in the direction of an arrow B shown in FIG. 1. Two adjacent grids 22 are sequentially and selectively driven based on the outputs from the shift register.

In the example shown in FIG. 1, two grids 22 corresponding to the grids G3 and G4 indicated by the bold broken lines are selected by the grid driver circuit 34. In this case, the anodes 24 facing the two grids 22 corresponding to the grids G3 and G4 indicated by the bold broken lines allow an ON display.

In the example of the fluorescent display tube 20 shown in FIG. 1, nine anodes 24 in three columns (column A, column B, and column C) and three stages positioned at the center of the two grids 24 (G3 and G4) form an ON pixel group, and a region enclosed by a broken line 40 indicates an ON pixel region. The anodes 24 (D, E, and F) on either side of the ON pixel region 40 are OFF pixels.

In the present embodiment, one pixel is formed by three adjacent anodes 22 in each stage. In this case, four grayscales are realized by (1, 1, 1), (1, 0, 1), (0, 1, 0), and (0, 0, 0) as four types of combinations of the signal logic of potentials supplied to the three adjacent anodes 22, for example.

The display principle in the ON pixel is that electrons discharged between the anode and a cathode collide with a phosphor surface to cause emission of light. If an electric field occurs between the anode and the cathode in the pixel adjacent to the ON pixel, electrons in the ON pixel collide with the phosphor surface in the pixel adjacent to the ON pixel, whereby the resulting image becomes unclear. Therefore, the anodes 24 (D, E, and F) on either side of the ON pixel region 40 are set as OFF pixels, and the anode signals 1D to 1F, 2D to 2F, and 3D to 3F supplied to these anodes 24 are set at an OFF potential.

The arrangement order of the data signals in the anode driver circuit 32 is A, F, B, E, C, and D in each stage so that the signals supplied to the ON pixels and the signals supplied to the OFF pixels are alternately arranged.

In order to cause all the pixels in the fluorescent display tube 20 shown in FIG. 1 to be turned ON, one vertical scan which selects two grids 22 is repeated six times along a horizontal scan direction C so that the grids are scanned in the order of G1+G2→G2+G3→G3+G4→G4+G5→G5+G6→G6+G7.

Shift Register

Figure 2:
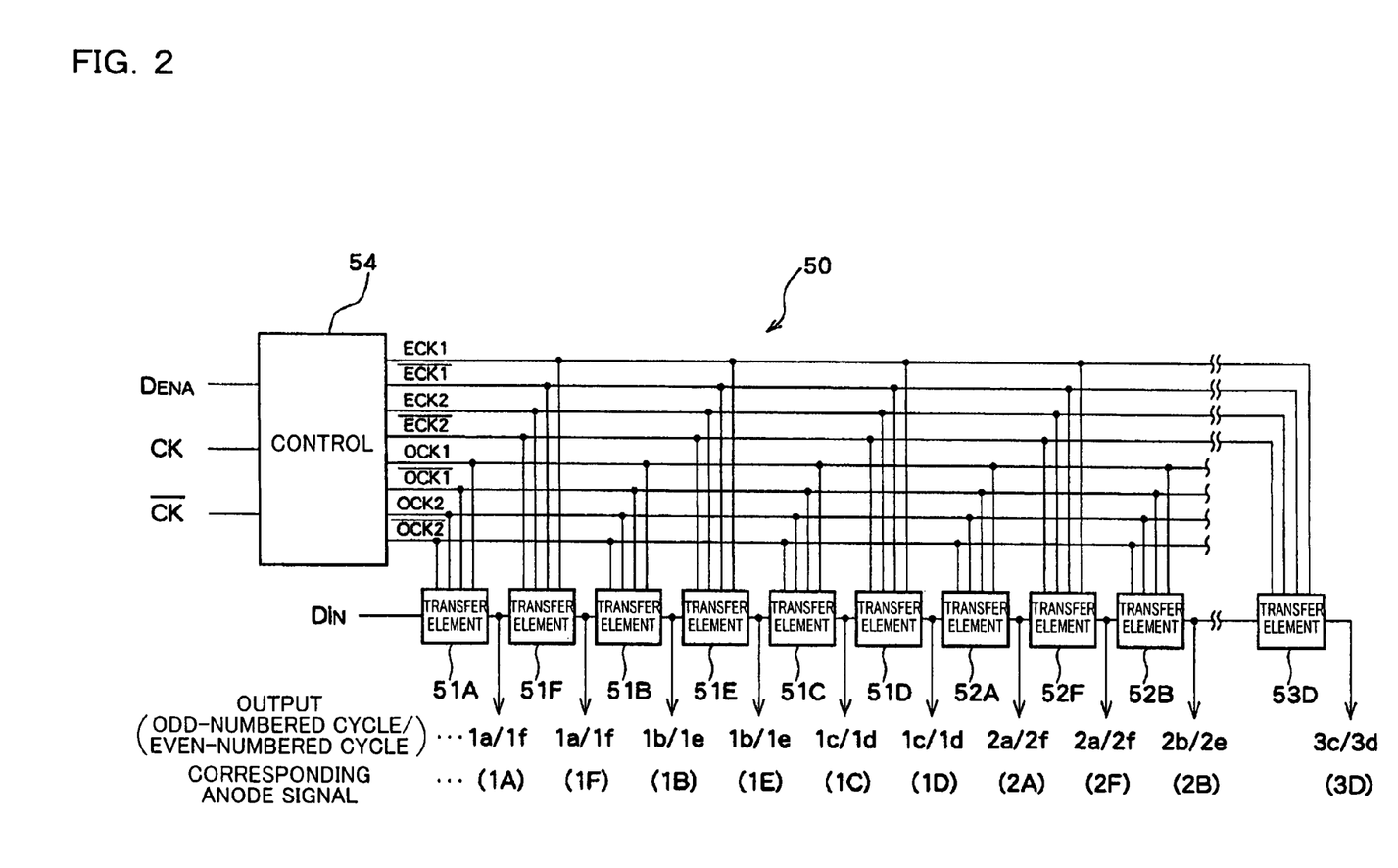
FIG. 2 is a block diagram of a shift register provided in an anode driver circuit shown in FIG. 1.

A shift register 50 of the present invention is provided in the anode driver circuit 32. FIG. 2 shows an example of the shift register 50.

Figure 3:
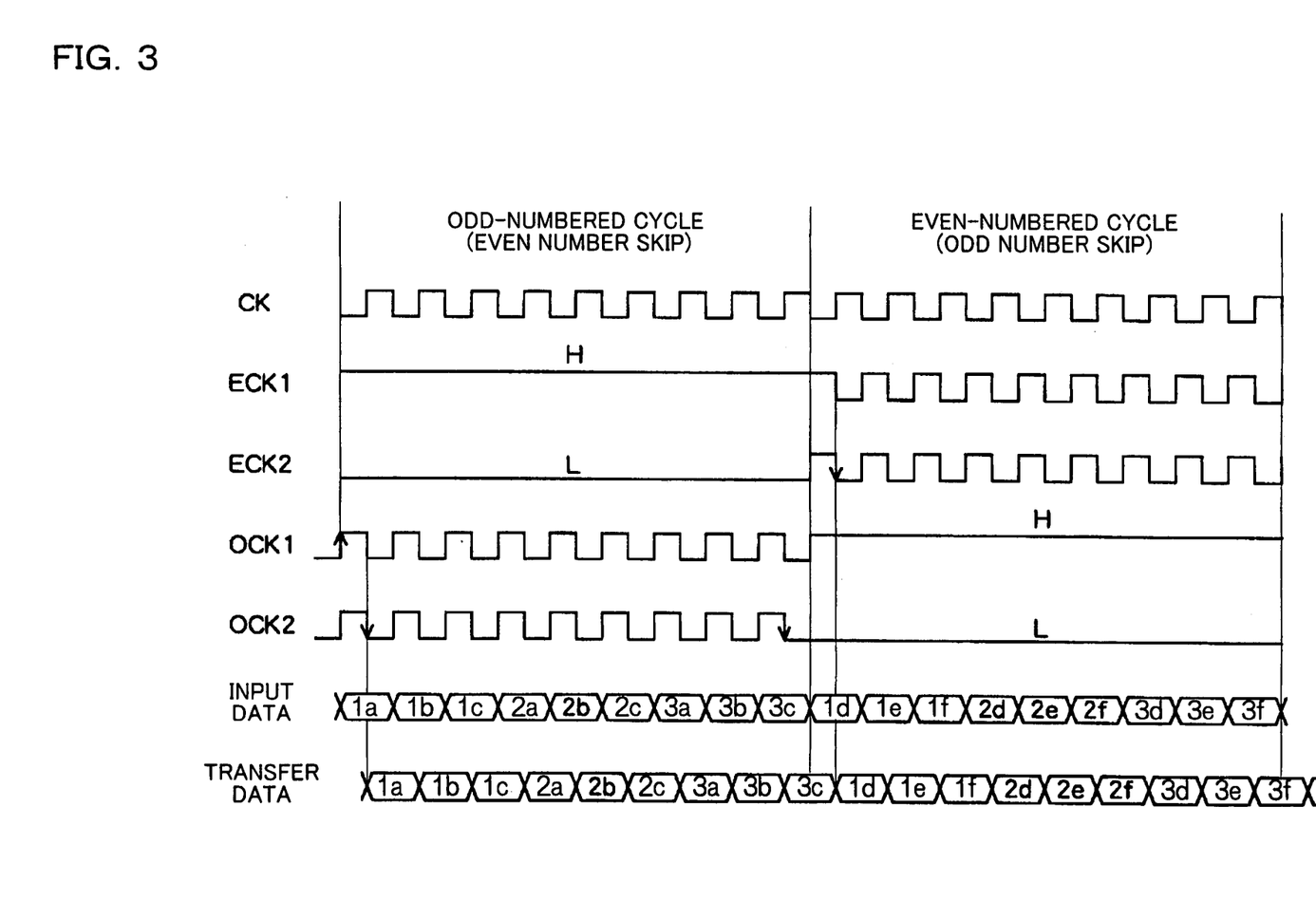
FIG. 3 is an operation timing chart of the shift register shown in FIG. 2.

The shift register 50 includes M (M=18 in the present embodiment) stages of transfer elements 51A to 51F, 52A to 52F, and 53A to 53F (52C to 52E, 53A to 53C, 53E, and 53F are omitted in FIG. 2) which transfer N (N=9 in the present embodiment) data signals sequentially input within one cycle. In the present embodiment, nine data signals transferred within one odd-numbered cycle shown in FIG. 3 are input data signals $1a$ to $1c$, $2a$ to $2c$, and $3a$ to $3c$ shown in FIG. 3, and respectively correspond to the anode signals 1A to 1C, 2A to 2C, and 3A to 3C. Nine data signals transferred within one even-numbered cycle shown in FIG. 3 are input data signals $1d$ to $1f$, $2d$ to $2f$, and $3d$ to $3f$ shown in FIG. 3, and respectively correspond to the anode signals 1D to 1F, 2D to 2F, and 3D to 3F.

The 18 stages of transfer elements 51A to 51F, 52A to 52F, and 53A to 53F are provided corresponding to the arrangement order of the anode signals 1A to 1F, 2A to 2F, and 3A to 3F arranged and output along the shift direction A shown in FIG. 1.

Specifically, the output from the transfer element 51A in the first stage corresponds to the anode signal 1A in the first stage, the output from the transfer element 51F in the second stage corresponds to the anode signal 1F in the second stage, and the output from the transfer element 53D in the final stage corresponds to the anode signal 3D in the final stage.

Figure 6:
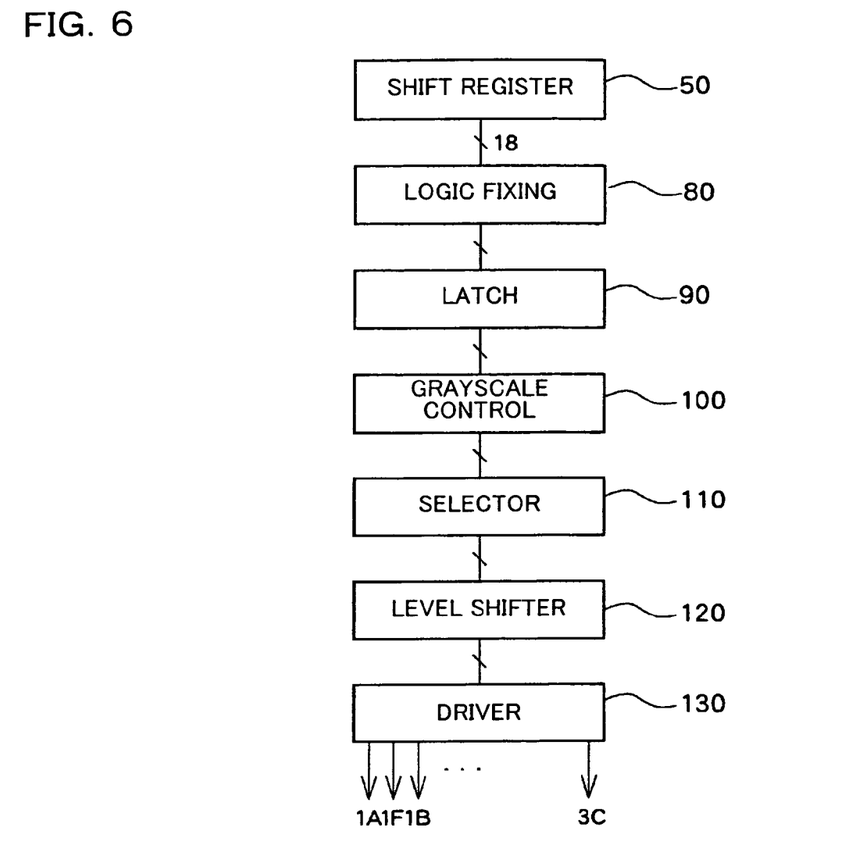
FIG. 6 is a block diagram of an example of an anode driver circuit shown in FIG. 1.

The outputs from the 18-stages of transfer elements 51A to 51F, 52A to 52F, and 53A to 53F are not directly used as the anode signals 1A to 1F, 2A to 2F, and 3A to 3F. Various circuits as described later with reference to FIG. 6 are provided in the output stage of the transfer elements 51A to 51F, 52A to 52F, and 53A to 53F.

The 18 stages of transfer elements 51A to 51F, 52A to 52F, and 53A to 53F are controlled by a control circuit 54. A control signal $D_{ENA}$ and clock signals CK and /CK are input to the control circuit 54.

As shown in FIG. 3, the number of clock signals CK generated within one odd-numbered or even-numbered cycle is N=9. This number is equal to the number N of data transferred within one cycle, but is smaller than the number of stages of the transfer elements (M=18).

In the present embodiment, only the odd-numbered transfer elements 51A, 51B, 51C, 52A, 52B, 52C, 53A, 53B, and 53C shown in FIG. 2 perform the original transfer operation of holding the input data signal instead of the data signal which has been held by the transfer element in one odd-numbered cycle. In this case, the even-numbered transfer elements 51F, 51E, 51D, 52F, 52E, 52D, 53F, 53E, and 53D shown in FIG. 2 allow the data signal which has been held by the transfer element in the preceding stage to pass therethrough to the transfer element in the subsequent stage.

In one even-numbered cycle, only the even-numbered transfer elements 51F, 51E, 51D, 52F, 52E, 52D, 53F, 53E, and 53D shown in FIG. 2 perform the original transfer operation of holding the input data signal instead of the data signal which has been held by the transfer element. In this case, the odd-numbered transfer elements 51A, 51B, 51C, 52A, 52B, 52C, 53A, 53B, and 53C shown in FIG. 2 allow the data signal which has been held by the transfer element in the preceding stage to pass therethrough to the transfer element in the subsequent stage.

In the present embodiment, the transfer element which allows data to pass therethrough also has a function of holding the data. Therefore, the output from the first and second transfer element 51A and 51F is the data signal $1a$ in the odd-numbered cycle and is the data signal $1f$ in the even-numbered cycle. In FIG. 2, the output from the first and second transfer element 51A and 51F is indicated as $1a/1f$. In FIG. 2, the output from each transfer element is indicated as (output in odd-numbered cycle)/(output in even-numbered cycle).

The control circuit 54 controls switching between the data transfer operation and the data skip operation (data through operation) for each of the 18 stages of transfer elements 51A to 51F, 52A to 52F, and 53A to 53F based on the control signal $D_{ENA}$ and the clock signals CK and /CK.

The control signal $D_{ENA}$ is a signal which indicates either the odd-numbered cycle or the even-numbered cycle. In other words, the control circuit 54 causes only the odd-numbered transfer elements 51A, 51B, 51C, 52A, 52B, 52C, 53A, 53B, and 53C shown in FIG. 2 to perform the transfer operation and causes the even-numbered transfer elements 51F, 51E, 51D, 52F, 52E, 52D, 53F, 53E, and 53D to perform the skip operation in the odd-numbered cycle based on the control signal $D_{ENA}$. The control circuit 54 causes only the even-numbered transfer elements 51F, 51E, 51D, 52F, 52E, 52D, 53F, 53E, and 53D shown in FIG. 2 to perform the transfer operation and causes the odd-numbered transfer elements 51A, 51B, 51C, 52A, 52B, 52C, 53A, 53B, and 53C to perform the skip operation in the even-numbered cycle based on the control signal $D_{ENA}$.

In order to switch the operation, clock signals ECK1, /ECK1, ECK2, and /ECK2 are supplied to the even-numbered transfer elements 51F, 51E, 51D, 52F, 52E, 52D, 53F, 53E, and 53D. Clock signals OCK1, /OCK1, OCK2, and /OCK2 are supplied to the odd-numbered transfer elements 51A, 51B, 51C, 52A, 52B, 52C, 53A, 53B, and 53C.

Specific Configuration of Transfer Element

Figure 4:
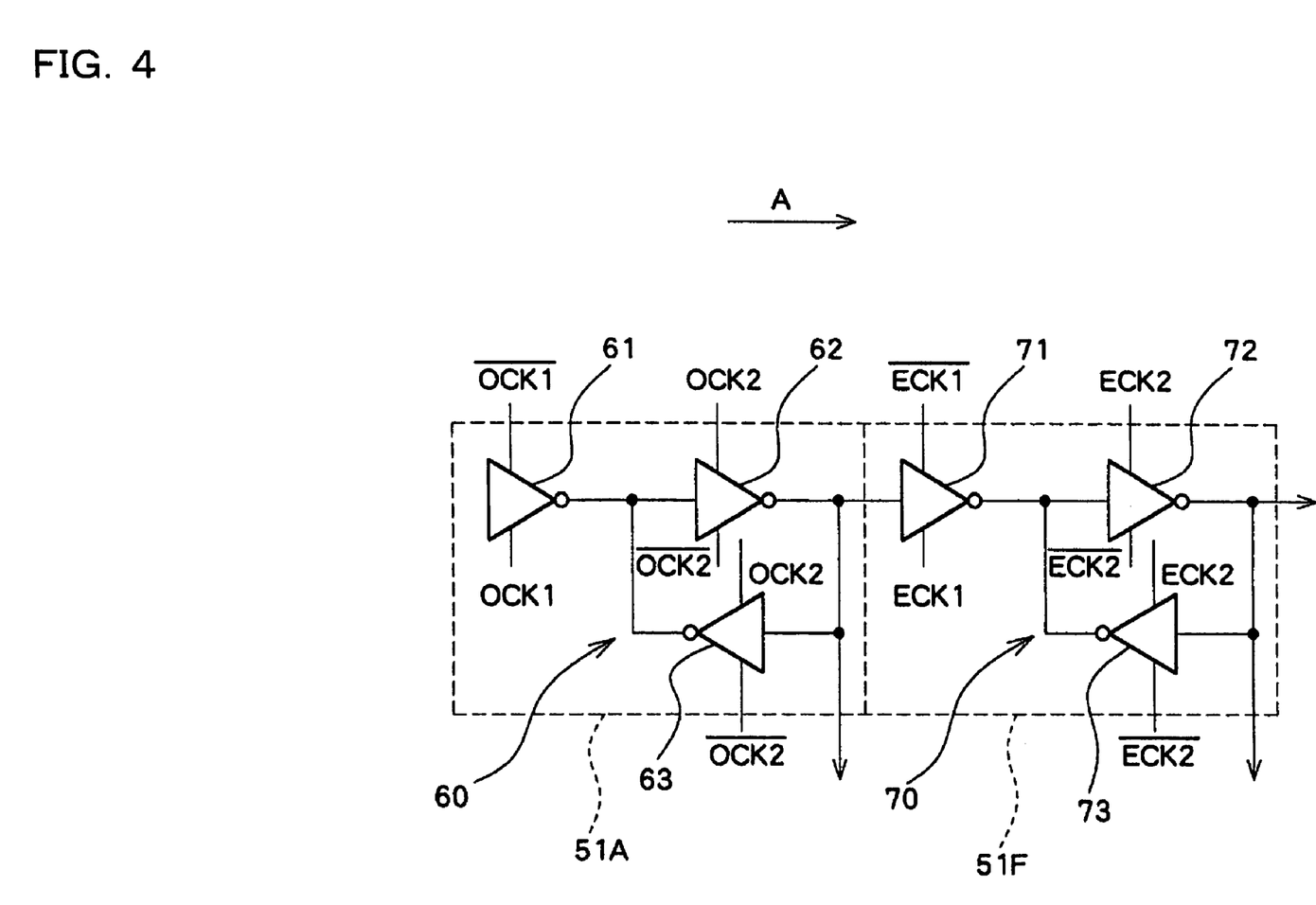
FIG. 4 is a circuit diagram illustrating two of 18 stages of transfer elements shown in FIG. 2.

FIG. 4 shows the transfer element 51A in the first stage and the transfer element 51F in the second stage. The transfer element 51A includes a first clocked inverter 61 provided in the upstream in the shift direction A, and a flip-flop 60 connected in series with the first clocked inverter 61 in the downstream in the shift direction A. The flip-flop 60 is formed by loop-connecting second and third clocked inverters 62 and 63. The transfer element 51F in the subsequent stage includes a flip-flop 70 and a first clocked inverter 71. The flip-flop 70 is formed by loop-connecting second and third clocked inverters 72 and 73.

Figure 5:
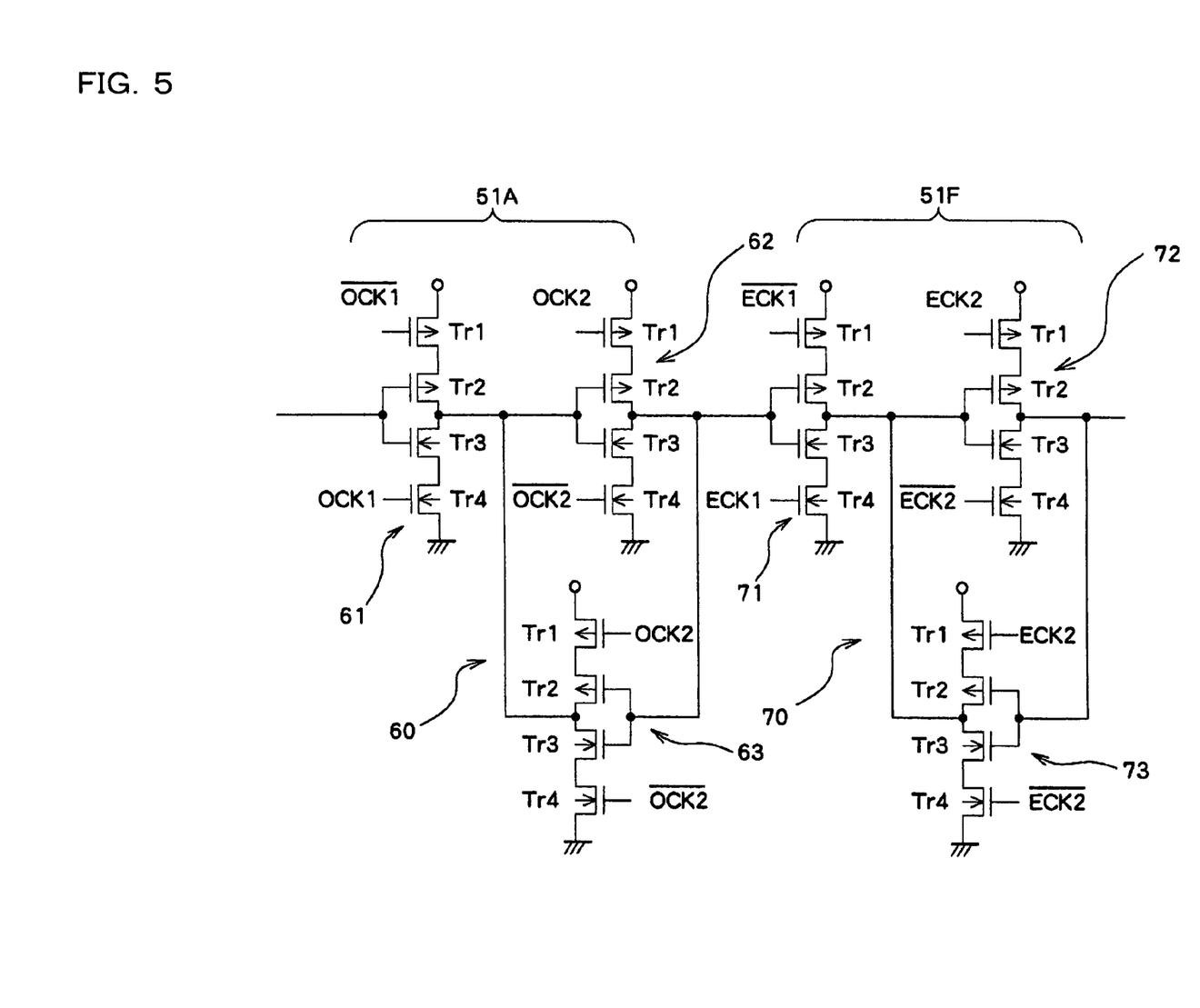
FIG. 5 is a connection diagram of transistors which form the two stages of transfer elements shown in FIG. 4.

FIG. 5 is a transistor circuit diagram of the clocked inverters 61 to 63 and 71 to 73 shown in FIG. 4. The clocked inverters 61 to 63 and 71 to 73 have the same configuration, and are formed by serially connecting two P-type transistors Tr1 and Tr2 and two N-type transistors Tr3 and Tr4 between a power supply and ground. Gates of the P-type transistor Tr2 and the N-type transistor Tr3 are connected with a common input terminal, and drains of the P-type transistor Tr2 and the N-type transistor Tr3 are connected with a common output terminal. The clock signals from the control circuit 54 are input to gates of the P-type transistor Tr1 and the N-type transistor Tr4.

Shift Operation in Odd-Numbered Cycle

In the odd-numbered cycle, the clock signal ECK1 is set at HIGH (first fixed logic signal) and the clock signal ECK2 is set at LOW (second fixed logic signal) during the odd-numbered cycle period, as shown in FIG. 3. Therefore, the clock signal /ECK1 is set at LOW and the clock signal /ECK2 is set at HIGH although these clock signals are omitted in FIG. 3. These clock signals are called skip fixed logic signals.

In the even-numbered logic element 51F to which the skip fixed logic signals are input, the P-type transistors Tr1 and the N-type transistors Tr4 of the three clocked inverters 71 to 73 shown in FIG. 5 are always set in the ON state. Therefore, the output from each of the three clocked inverters 71 to 73 shown in FIG. 5 is LOW (N-type transistor Tr3 is turned ON) when the input data is HIGH, and is HIGH (N-type transistor Tr2 is turned ON) when the input data is LOW.

Therefore, in the even-numbered transfer element 51F, the output from the first clocked inverter 71 is LOW and the output from the second clocked inverter 72 in the subsequent stage is HIGH when the input data is HIGH, whereby the input data is output in the same logic state. In this case, the data HIGH is held by the flip-flop 70 formed by the second and third clocked inverters 72 and 73. When the data input to the even-numbered transfer element 51F is LOW, the input data passes through the transfer element 51F, whereby the output data is also set at LOW. The data LOW is held by the flip-flop 70. The above-described data through operation is performed by all of the even-numbered transfer elements 51F, 51E, 51D, 52F, 52E, 52D, 53F, 53E, and 53D.

The clock signals OCK1 and OCK2 input to the transfer element 51A in the first stage are shift clock signals which are the same as the inversion signal of the clock signal CK (specifically, the same as the inversion clock signal /CK). The inversion clock signals /OCK1 and /OCK2 (not shown in FIG. 3) are shift clock signals which are the same as the clock signal CK.

Each of the shift clock signals OCK1 and OCK2 has a rising edge (first edge) and a falling edge (second edge). In the first clocked inverter 61 of the odd-numbered transfer element 51A, since the P-type transistor Tr1 and the N-type transistor Tr4 are turned ON at the timing of the rising edge (first edge) of the shift clock signal OCK1, the first clocked inverter 61 reverses the input data at this timing and transfers the resulting data. In the second clocked inverter 62 in the subsequent stage, since the P-type transistor Tr1 and the N-type transistor Tr4 are turned ON at the timing of the falling edge (second edge) of the shift clock signal OCK2, the second clocked inverter 62 reverses the data signal input through the first clocked inverter 61 at this timing and transfers the resulting data signal. The output from the second clocked inverter 62 is held by the flip-flop 60. The first data signal 3c is thus held by the transfer element 51A in the first stage at the timing of the falling edges (second edges) of the first clock signals OCK1 and OCK2.

Since the transfer element 51F in the second stage performs the data through operation as described above, the first data signal 3c is also output from the transfer element 51F in the second stage and is held by the transfer element 51F in the second stage.

The second data signal 3b and the first data signal 3c are respectively transferred by the transfer element 51A in the first stage and the transfer element 51B in the third stage at the second falling edge of the shift clock signal OCK1. In this case, the transfer elements 51F and 51E in the second stage and the fourth stage perform the through operation.

The ninth data signal 1a is held by the transfer element 51A in the first stage at the falling edges of the ninth clock signals OCK1 and OCK2 by repeating the above-described operation. The output states of the 18 stages of shift elements 51A to 51F, 52A to 52F, and 53A to 53F during this operation are shown in FIG. 2 as the outputs in the odd-numbered cycle.

Shift Operation in Even-Numbered Cycle

In the even-numbered cycle, the clock signal OCK1 is set at HIGH (first fixed logic signal) and the clock signal OCK2 is set at LOW (second fixed logic signal) during the even-numbered cycle period, as shown in FIG. 3. Therefore, the clock signal /OCK1 is set at LOW and the clock signal /OCK2 is set at HIGH although these clock signals are omitted in FIG. 3. These clock signals are called skip fixed logic signals.

Therefore, the data through operation is performed by the odd-numbered transfer elements 51A, 51B, 51C, 52A, 52B, 52C, 53A, 53B, and 53C in the even-numbered cycle.

The clock signals ECK1 and ECK2 input to the even-numbered transfer elements 51F, 51E, 51D, 52F, 52E, 52D, 53F, 53E, and 53D are shift clock signals which are the same as the inversion signal of the clock signal CK (specifically, the same as the inversion clock signal /CK). The inversion clock signals /ECK1 and /ECK2 (not shown in FIG. 3) are shift clock signals which are the same as the clock signal CK.

Therefore, data is transferred by the even-numbered transfer elements 51F, 51E, 51D, 52F, 52E, 52D, 53F, 53E, and 53D at the timing of the falling edges of the clock signals ECK1 and ECK2.

In the even-numbered cycle, the ninth data signal 1f is held by the transfer element 51F in the second stage at the falling edges of the ninth clock signals ECK1 and ECK2. The output states of the 18 stages of shift elements 51A to 51F, 52A to 52F, and 53A to 53F during this operation are shown in FIG. 2 as the outputs in the even-numbered cycle.

As described above, in the present embodiment, nine pieces of data can be transferred by the 18 stages of transfer elements based on the nine clock signals CK, whereby the data transfer time can be halved in comparison with a conventional method. In this case, the same data is held by the adjacent odd-numbered and even-numbered transfer elements. Therefore, when enlarging an image in a display device such as a liquid crystal display device or an EL display device by interpolating pixel data, the outputs from the shift register 40 can be directly utilized.

However, when driving the fluorescent display tube 20 shown in FIG. 1, ON data is also transmitted to the OFF pixels outside the ON pixel region 40 shown in FIG. 1. Therefore, in the present embodiment, the anode driver circuit 32 shown in FIG. 1 is configured as shown in FIG. 6.

Anode Driver Circuit

FIG. 6 is a block diagram of the anode driver circuit 32. FIG. 6 shows an anode circuit for driving the on-board fluorescent display tube 20, for example, and includes a logic fixing circuit 80, a latch circuit 90, a grayscale control circuit 100, a selector 110, a level shifter 120, and a driver 130 in the subsequent stage of the shift register 40. The selector 110 changes the luminance in synchronization with lighting of a headlight of a vehicle or the like.

Figure 7:
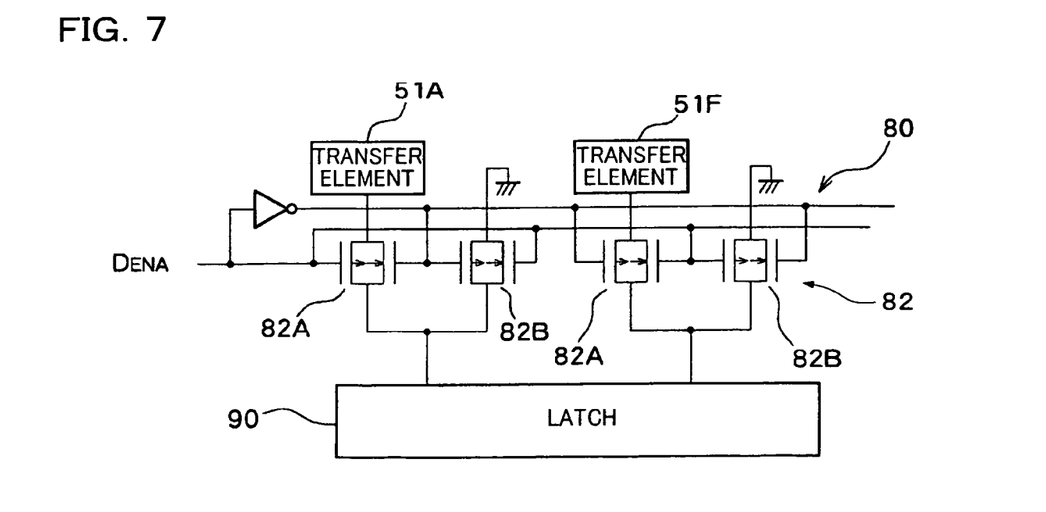
FIG. 7 is a circuit diagram showing an example of a logic fixing circuit shown in FIG. 6.

FIG. 7 shows an example of the logic fixing circuit 80. FIG. 7 shows a part of the logic fixing circuit 80 connected with the output stages of the transfer element 51A in the first stage and the transfer element 51F in the second stage. A switch circuit 82 which selects the output from the transfer element 51A or 51F or the non-display data (ground potential, for example) is provided on the output side of each of the transfer elements 51A and 51F. The switch circuit 82 includes a first transmission gate 82A connected with the output line of the transfer element 51A or 51F and a second transmission gate 82B connected with the ground potential. The first and second transmission gates 82A and 82B are switched corresponding to the logic of the control signal $D_{ENA}$ so that one of the first and second transmission gates 82A and 82B is turned ON, for example. In FIG. 7, the logic of the control signal $D_{ENA}$ is set at HIGH in the odd-numbered cycle, whereby the first transmission gate 82A connected with the transfer element 51A in the odd-numbered stage is turned ON. Therefore, the data signals 1*a* to 1*c*, 2*a* to 2*c*, and 3*a* to 3*c* from the odd-numbered transfer elements 51A, 51B, 51C, 52A, 52B, 52C, 53A, 53B, and 53C shown in FIG. 2 are latched by the latch circuit 90 through the logic fixing circuit 80.

In the odd-numbered cycle, the first transmission gate 82A connected with the even-numbered transfer element 51F shown in FIG. 7 is turned OFF. The second transmission gate 82B is turned ON, whereby the ground potential (non-display data "0") is output. The data signals 1*a* to 1*c*, 2*a* to 2*c*, and 3*a* to 3*c* from the even-numbered transfer elements 51F, 51E, 51D, 52F, 52E, 52D, 53F, 53E, and 53D shown in FIG. 2 are blocked by the logic fixing circuit 80, and the non-display data "0" is latched by the latch circuit 90 instead of the data signals 1*a* to 1*c*, 2*a* to 2*c*, and 3*a* to 3*c*.

As a result, the non-display data is transmitted to the anodes 24 which face the selected grids G3 and G4 and are positioned outside the ON pixel region 40 shown in FIG. 1 (corresponding to the anode signals 1D to 1F, 2D to 2F, and 3D to 3F). Therefore, the fluorescent display tube 20 can be suitably driven.

In the even-numbered cycle, the logic of the control signal $D_{ENA}$ is set at LOW, whereby the outputs 1*d* to 1*f*, 2*d* to 2*f*, and 3*d* to 3*f* from the even-numbered transfer elements 51F, 51E, 51D, 52F, 52E, 52D, 53F, 53E, and 53D shown in FIG. 2 are latched by the latch circuit 90 through the logic fixing circuit 80. The outputs 1*d* to 1*f*, 2*d* to 2*f*, and 3*d* to 3*f* from the odd-numbered transfer elements 51A, 51B, 51C, 52A, 52B, 52C, 53A, 53B, and 53C shown in FIG. 2 are blocked by the logic fixing circuit 80, and the non-display data "0" is latched by the latch circuit 90 instead of the outputs 1*d* to 1*f*, 2*d* to 2*f*, and 3*d* to 3*f*. Therefore, the ON data can be transmitted to only the pixels in the ON pixel region even in the even-numbered cycle, whereby the fluorescent display tube 20 can be suitably driven.

Bidirectional Shift Register

Figure 8:
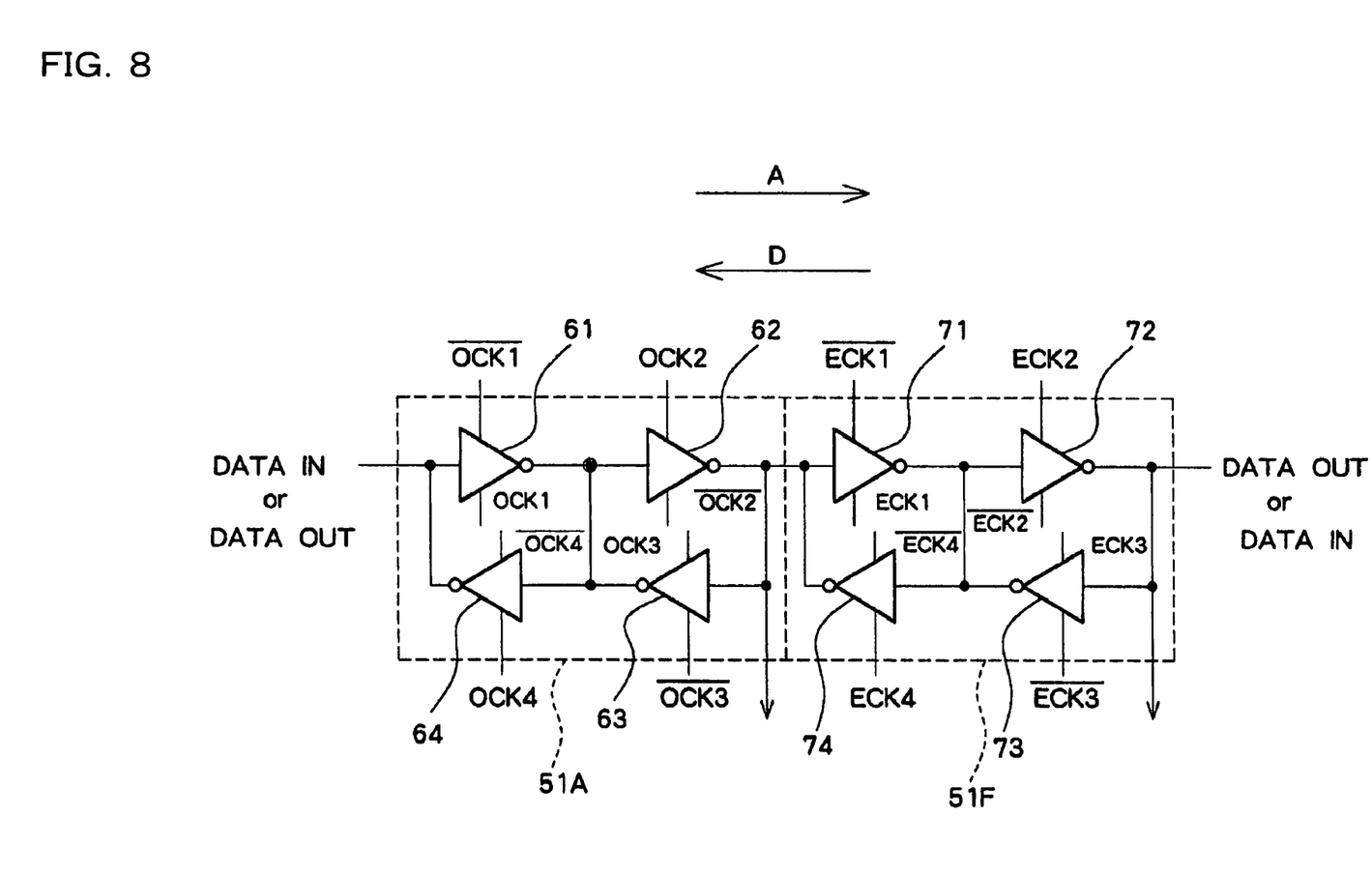
FIG. 8 is a circuit diagram of a bidirectional shift register.
Figure 9:
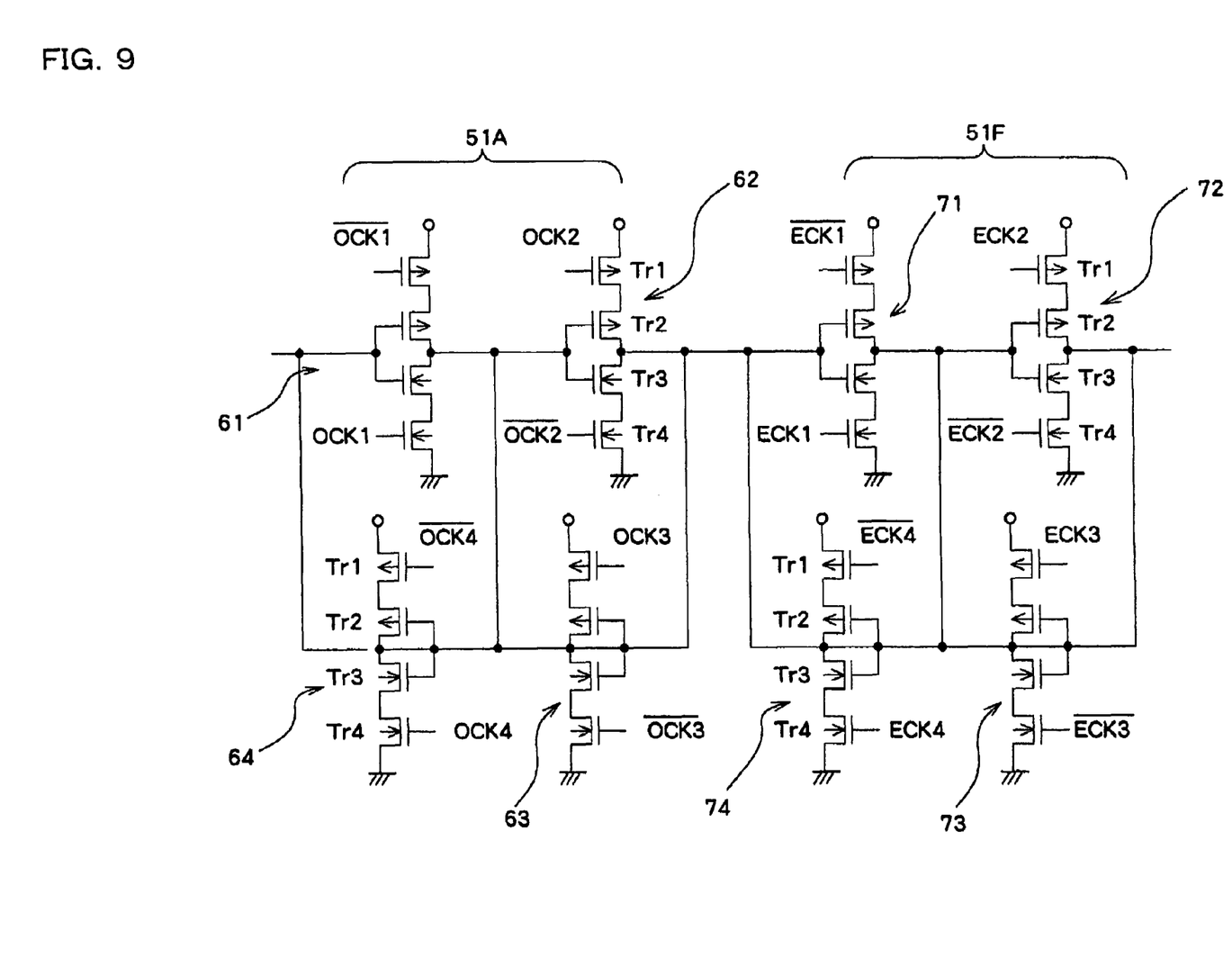
FIG. 9 is a connection diagram of transistors which form the two stages of transfer elements shown in FIG. 8.

FIGS. 8 and 9 show an example of a bidirectional shift register formed by modifying the unidirectional shift register shown in FIG. 4. In FIG. 8, fourth clocked inverters 64 and 74 are respectively added to the transfer elements 51A and 51F.

The clock signals supplied to the third clocked inverter 63 of the transfer element 51A are defined as clock signals OCK3 and /OCK3, and the clock signals supplied to the third clocked inverter 73 of the transfer element 51F are defined as clock signals ECK3 and /ECK3, differing from FIG. 4. Clock signals OCK4 and /OCK4 are supplied to the additional fourth clocked inverter 64, and clock signals ECK4 and /ECK4 are supplied to the additional fourth clocked inverter 74.

Figure 10:
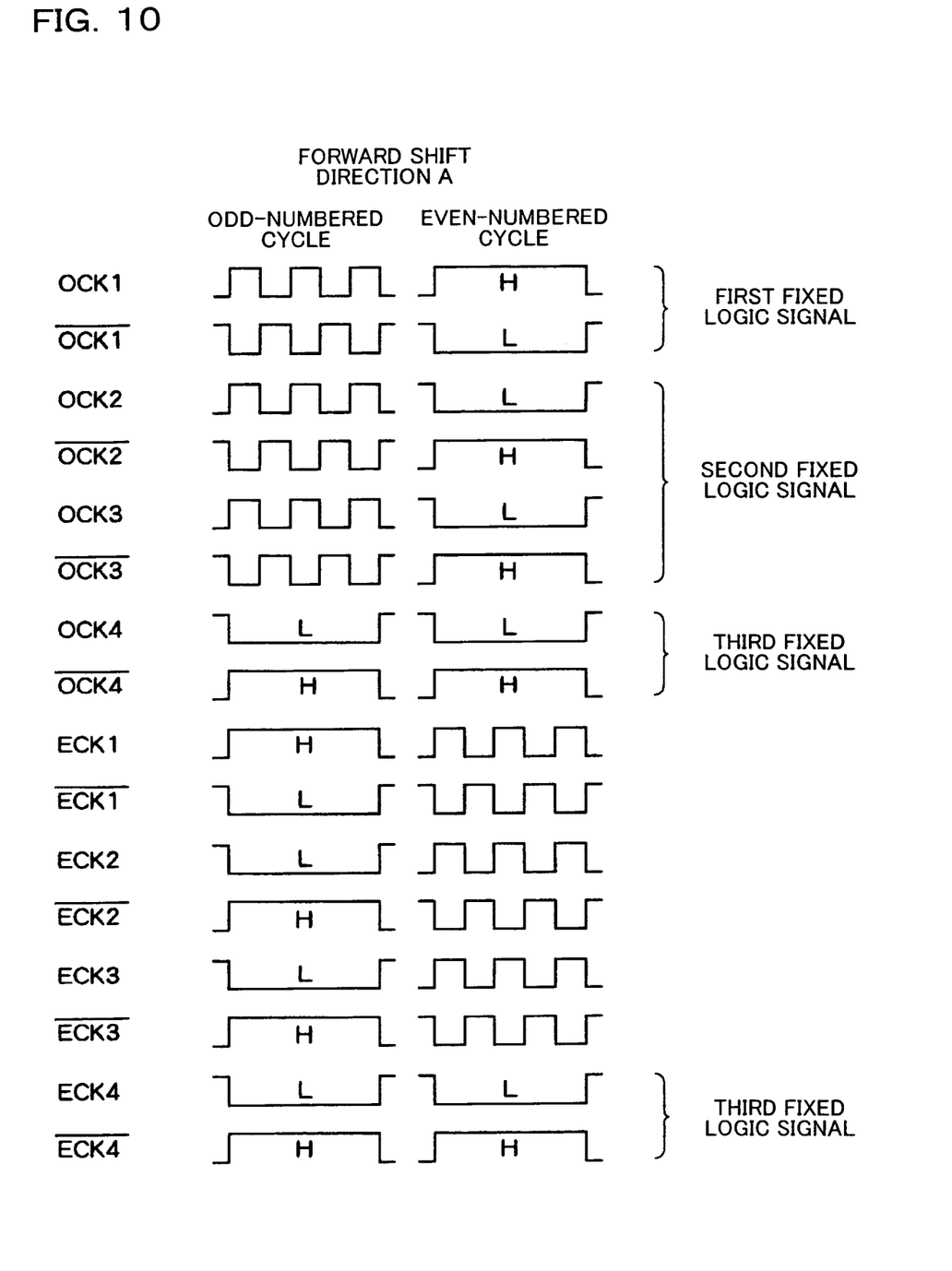
FIG. 10 is a waveform diagram of clock signals used in a forward shift operation in the bidirectional shift register in FIGS. 8 and 9.
Figure 11:
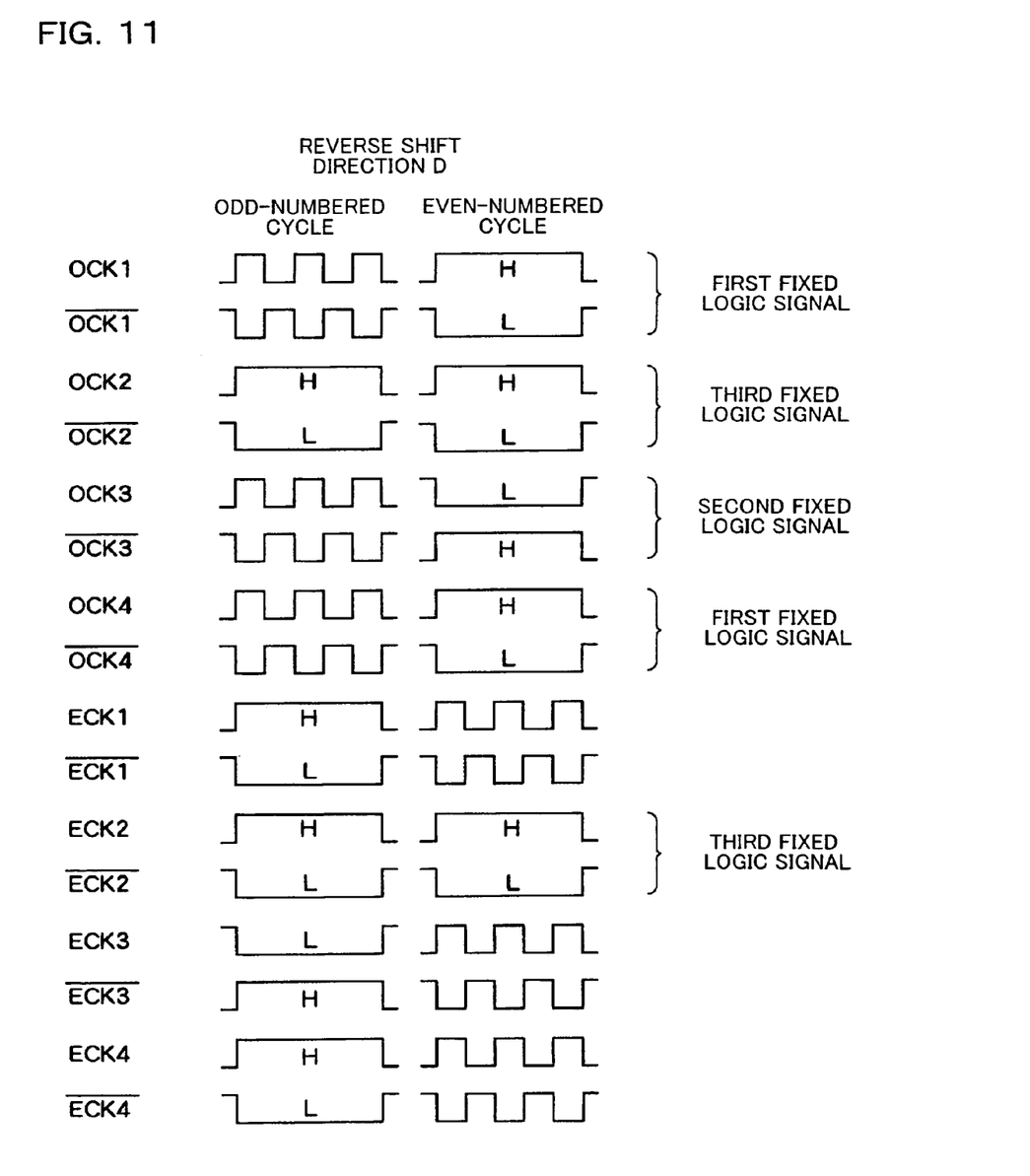
FIG. 11 is a waveform diagram of clock signals used in a reverse shift operation in the bidirectional shift register in FIGS. 8 and 9.

FIGS. 10 and 11 show the state of each clock signal when the shift direction is the shift direction A or the reverse shift direction D.

Since the shift operation in the forward shift direction A shown in FIG. 10 can be performed by the configuration shown in FIG. 5, it is unnecessary to operate the fourth clocked inverters 64 and 74 shown in FIGS. 8 and 9. Therefore, as shown in FIG. 10, the clock signals OCK4 and ECK4 supplied to the fourth clocked inverters 64 and 74 are fixed at LOW, and the inversion clock signals /OCK4 and /ECK4 are fixed at HIGH both in the odd-numbered cycle and the even-numbered cycle. This causes the P-type transistors Tr1 and the N-type transistors Tr4 of the fourth clocked inverters 64 and 74 to be always set in the OFF state, whereby the fourth clocked inverters 64 and 74 are set in the open state. The clock signal OCK1 fixed at HIGH and the clock signal /OCK fixed at LOW in the even-numbered cycle are called first fixed logic signals, the clock signals OCK2 and OCK3 fixed at LOW and the clock signals /OCK2 and /OCK3 fixed at HIGH are called second fixed logic signals, and the clock signals OCK4, /OCK4, ECK4, and /ECK4 are called third fixed logic signals.

In the shift operation in the reverse shift direction D shown in FIG. 11, it is unnecessary to operate the second clocked inverters 62 and 72 shown in FIGS. 8 and 9. Therefore, as shown in FIG. 11, the clock signals OCK2 and ECK2 supplied to the second clocked inverters 62 and 72 are fixed at HIGH and the inversion clock signals /OCK2 and /ECK2 are fixed at LOW both in the odd-numbered cycle and the even-numbered cycle. This causes the P-type transistors Tr1 and the N-type transistors Tr4 of the second clocked inverters 62 and 72 to be always set in the OFF state, whereby the second clocked inverters 62 and 72 are set in the open state. In this case, in the transfer element 51A, the third clocked inverter 63 functions as the inverter in the preceding stage, and the first and fourth clocked inverters 61 and 64 function as the flip-flop in the subsequent stage. The same description also applies to the transfer element 51F.

In order to switch the clock signals shown in FIGS. 10 and 11, a reverse shift signal which designates the reverse shift direction D differing from the forward shift direction A may be further input to the control circuit 40 shown in FIG. 2 in addition to the control signal $D_{ENA}$ and the clock signals CK and /CK shown in FIG. 2.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

The present invention is not limited to the case where the data shift operation and the data through operation are switched for the even-numbered transfer elements and the odd-numbered transfer elements. M (M>N, M is an integer larger than two) stages of transfer elements which transfer N (N is an integer larger than one) data signals sequentially input within one cycle may be provided. N clock signals and the control signal may be input within one cycle. The shift clock signals may be supplied to arbitrary N stages of transfer elements among the M stages of transfer elements, and the skip fixed logic signals may be supplied to the remaining (M−N) stages of transfer elements based on the control signal.

The shift register of the present invention may be used not only to drive a fluorescent display tube, but also to transfer data in a matrix type display device such as a liquid crystal display device or an EL display device. The shift register of the present invention may be used to enlarge a display as described above.

What is claimed is:

1. A shift register, comprising:
   M (M is an integer larger than two) stages of transfer elements that transfer N (M>N, N is an integer larger than one) data signals sequentially input within one cycle; and
   a control circuit to which N clock signals and a control signal are input within the one cycle and that supplies a shift clock signal to N stages of the transfer elements among the M stages of the transfer elements and supplies a skip fixed logic signal to (M−N) stages of the transfer elements among the M stages of the transfer elements based on the control signal,
   each of the N stages of the transfer elements holding an input data signal instead of a data signal that has been held by the each of the N stages of the transfer elements based on the shift clock signal, and
   each of the (M−N) stages of the transfer elements allowing a data signal that has been held by one of the transfer elements in a preceding stage to pass therethrough to one of the transfer elements in a subsequent stage based on the skip fixed logic signal.

2. The shift register as defined in claim 1,
   each of the M stages of the transfer elements including a first clocked inverter provided in an upstream in a shift direction of the data signals, and a flip-flop connected in series with the first clocked inverter in a downstream in the shift direction, and
   the flip-flop including second and third clocked inverters that are loop-connected.

3. The shift register as defined in claim 2,
   the shift clock signal having a first edge and a second edge,
   the first clocked inverter reversing an input data signal and transferring the reversed data signal at a timing of the first edge of the shift clock signal,
   the second clocked inverter reversing a data signal input through the first clocked inverter and transferring the reversed data signal, at a timing of the second edge of the shift clock signal, and
   the second and third clocked inverters holding logic of the data signal transferred, at the timing of the second edge.

4. The shift register as defined in claim 2,
   the skip fixed logic signal including a first fixed logic signal supplied to the first clocked inverter, and a second fixed logic signal supplied to the flip-flop, the second fixed logic signal having a phase that is a reverse of a phase of the first fixed logic signal, and
   each of the (M−N) stages of the transfer elements allowing a data signal that has been held by one of the transfer elements in the preceding stage to pass therethrough to one of the transfer elements in the subsequent stage based on the first and second fixed logic signals.

5. The shift register as defined in claim 3,
   the skip fixed logic signal including a first fixed logic signal supplied to the first clocked inverter, and a second fixed logic signal supplied to the flip-flop, the second fixed logic signal having a phase that is a reverse of a phase of the first fixed logic signal, and
   each of the (M−N) stages of the transfer elements allowing a data signal that has been held by one of the transfer elements in the preceding stage to pass therethrough to one of the transfer elements in the subsequent stage based on the first and second fixed logic signals.

6. The shift register as defined in claim 1, further comprising:
   a reverse shift signal, that designates a reverse shift direction differing from the shift direction, being further input to the control circuit,
   a fourth clocked inverter that is loop-connected with the first clocked inverter, and
   upon receiving the shift signal, the control circuit supplies a third fixed logic signal, and the flip-flop is formed by the first and fourth clocked inverters provided in a downstream of the third clocked inverter in the reverse shift direction, the third fixed logic signal setting the second clocked inverter in an open state.

7. The shift register as defined in claim 1,
   the control circuit supplying, in a cycle subsequent to the one cycle, the shift clock signal to the (M−N) stages of the transfer elements and supplies the skip fixed logic signal to the M stages of the transfer elements based on the control signal.

8. The shift register as defined in claim 7,
   the M stages of the transfer elements being disposed in one of odd-numbered stages and even-numbered stages, and the (M−N) stages of the transfer elements are disposed in the other of the odd-numbered stages and the even-numbered stages.

9. A display driver device, comprising:
   the shift register as defined in claim 1;
   a latch circuit connected with output lines of the N stages of the transfer elements of the shift register; and
   a driver circuit that outputs a display signal based on the data signal latched by the latch circuit.

10. The display driver device as defined in claim 9, further comprising:
    a logic fixing circuit that fixes logic of an output from one of the transfer elements that has allowed one of the data signals to pass therethrough based on the control signal.

11. A display device, comprising:
    the display driver device as defined in claim 9; and
    a display panel driven by the display driver device.

12. The display device as defined in claim 11,
    the display panel being a fluorescent display tube, and
    the display driver device outputting the display signal to a plurality of anode lines of the fluorescent display tube.

13. An electronic instrument, comprising the display device as defined in claim 12.

* * * * *